(12) United States Patent
Chi

(10) Patent No.: US 10,038,074 B2
(45) Date of Patent: Jul. 31, 2018

(54) MANUFACTURE METHOD OF TFT SUBSTRATE AND MANUFACTURED TFT SUBSTRATE

(71) Applicant: Shenzhen China Star Optoelectronics Technology Co., Ltd., Shenzhen (CN)

(72) Inventor: Shipeng Chi, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 274 days.

(21) Appl. No.: 15/105,572

(22) PCT Filed: Apr. 26, 2016

(86) PCT No.: PCT/CN2016/080189
§ 371 (c)(1),
(2) Date: Jun. 17, 2016

(87) PCT Pub. No.: WO2017/161625
PCT Pub. Date: Sep. 28, 2017

(65) Prior Publication Data
US 2018/0102417 A1    Apr. 12, 2018

(30) Foreign Application Priority Data
Mar. 23, 2016 (CN) .......................... 2016 1 0169540

(51) Int. Cl.
*H01L 29/66* (2006.01)
*H01L 29/786* (2006.01)
*H01L 21/02* (2006.01)

(52) U.S. Cl.
CPC .... *H01L 29/6675* (2013.01); *H01L 21/02667* (2013.01); *H01L 29/786* (2013.01)

(58) Field of Classification Search
CPC ............... H01L 29/6675; H01L 29/786; H01L 21/02667
See application file for complete search history.

(56) References Cited

U.S. PATENT DOCUMENTS 5,198,379 A * 3/1993 Adan ................. H01L 29/66477
257/E21.409
5,548,132 A * 8/1996 Batra ................. H01L 21/26506
257/327

(Continued)

*Primary Examiner* — Hoang-Quan Ho
(74) *Attorney, Agent, or Firm* — Leong C. Lei

(57) ABSTRACT

The present invention provides a manufacture method of a TFT substrate and a manufactured TFT substrate. By locating the first channel region and the first lightly doped offset region between the first source and the drain, and locating the second channel region and the second lightly doped offset region between the second source and the drain, and forming the first overlapping region and the second overlapping region respectively between the drain and the gate and between the second source and the gate, thus, the paths of the current flowing from the first, the second sources to the drain and the current flowing from the drain to the first, the second sources are the same. Namely, the current path from source to the drain and the current path from the drain to the source are the same. According, the symmetry of the TFT structure is realized.

13 Claims, 7 Drawing Sheets

(56) References Cited

U.S. PATENT DOCUMENTS

| | | | | |
|---|---|---|---|---|
| 5,808,317 | A * | 9/1998 | Kuo | H01L 29/42384 |
| | | | | 257/401 |
| 7,405,432 | B2 * | 7/2008 | Adachi | G03B 27/00 |
| | | | | 257/257 |
| 8,405,092 | B2 * | 3/2013 | Inoue | H01L 27/1225 |
| | | | | 257/222 |
| 2001/0019859 | A1 * | 9/2001 | Yamazaki | G02F 1/136213 |
| | | | | 438/149 |
| 2002/0105033 | A1 * | 8/2002 | Zhang | H01L 27/1214 |
| | | | | 257/353 |
| 2003/0207503 | A1 * | 11/2003 | Yamazaki | H01L 27/1214 |
| | | | | 438/149 |
| 2005/0023579 | A1 * | 2/2005 | Yamazaki | C23C 14/0057 |
| | | | | 257/288 |
| 2005/0100832 | A1 * | 5/2005 | Adachi | G03B 27/00 |
| | | | | 430/395 |
| 2010/0109009 | A1 * | 5/2010 | Noda | H01L 27/1214 |
| | | | | 257/59 |
| 2011/0101357 | A1 * | 5/2011 | Noda | H01L 27/1214 |
| | | | | 257/59 |
| 2018/0102417 | A1 * | 4/2018 | Chi | H01L 29/6675 |

* cited by examiner

MANUFACTURE METHOD OF TFT SUBSTRATE AND MANUFACTURED TFT SUBSTRATE

FIELD OF THE INVENTION

The present invention relates to a display technology field, and more particularly to a manufacture method of a TFT substrate and a manufactured TFT substrate.

BACKGROUND OF THE INVENTION

The OLED is a flat panel display technology which has great prospects for development. It possesses extremely excellent display performance, and particularly the properties of self-illumination, simple structure, ultra thin, fast response speed, wide view angle, low power consumption and capability of realizing flexible display, and therefore is considered as the "dream display". Meanwhile, the investment for the production equipments is far smaller than the TFT-LCD. It has been favored by respective big display makers and has become the main selection of the third generation display element of the display technology field. At present, the OLED has reached the point before mass production. With the further research and development, the new technologies constantly appear, and someday, there will be a breakthrough for the development of the OLED display elements.

The OLED can be categorized into two major types according to the driving ways, which are the Passive Matrix OLED (PMOLED) and the Active Matrix OLED (AMOLED), i.e. two types of the direct addressing and the Thin Film Transistor matrix addressing. The AMOLED comprises pixels arranged in array and belongs to active display type, which has high lighting efficiency and is generally utilized for the large scale display devices of high resolution.

At present, the AMOLED gradually becomes mature. In the AMOLED, it requires the current for driving. The Low Temperature Poly-Silicon (LTPS) has larger mobility, and the Thin Film Transistor (TFT) manufactured with the active layer can satisfy the current drive mode of the AMOLED. The Low Temperature Poly-Silicon Thin Film Transistor (LTPS TFT) has higher mobility and can achieve the higher on state current. However, the defect due to the grain existence in the LTPS will lead to the appearance of the higher off state current as the LTPS TFT is in off state. For decreasing the off state current of the LTPS TFT, the Lightly Doped Offset structure can be utilized. There are more researches about the Offset structure at present. Nevertheless, the offset structure forms the high resistance region which will reduce the on state current of the LTPS TFT. For gaining the higher on state current, the improvement can be performed to the offset structure.

In the LTPS TFT having the offset structure, for reducing the influence of the high resistance region to the on state current, the overlap structure can be added in the TFT. Namely, the source or drain has an overlap region with the gate, which can decrease the channel length and reduce the high resistance region, and to promote the on state current. In the LTPS TFT, the source or drain respectively utilize the offset structure and the overlap structure, which can realize the smaller off state current, and meanwhile the influence to the on state current is less. However, in one LTPS TFT, as the source and drain respectively utilize the offset structure and the overlap structure, it leads to the asymmetry of the TFT structure. In the practical work of the TFT, as the source and the drain are exchanged, the current flowing through the element is influenced due to the asymmetry of the element.

SUMMARY OF THE INVENTION

An objective of the present invention is to provide a manufacture method of a TFT substrate, in which by designing the gate and the source or drain to be U shape structure to make both the path from the drain to the source and the path from the source to the drain in the TFT require passing through two offset structures and two overlapping structures, which does not only reduce the off state, raise the on state current but also makes the current path possess symmetry to avoid the influence of the asymmetry of the element structure to the current path in the LTPS TFT and to raise the electrical performance of the TFT element.

Another objective of the present invention is to provide a TFT substrate, in which both the path from the drain to the source and the path from the source to the drain in the TFT requires passing through two offset structures and two overlapping structures, which does not only reduce the off state, raise the on state current but also makes the current path possess symmetry to avoid the influence of the asymmetry of the element structure to the current path in the LTPS TFT and to raise the electrical performance of the TFT element.

For realizing the aforesaid objectives, the present invention provides a manufacture method of a TFT substrate, comprising steps of:

step 1, providing a substrate, and forming a gate on the substrate, and the gate is a U shape structure, comprising a first vertical part, a second vertical part and a transverse connecting part, connecting corresponding end parts of the first vertical part and the second vertical part;

step 2, depositing a gate isolation layer on the gate and the substrate, and depositing amorphous silicon on the gate isolation layer to obtain an amorphous silicon film, and employing a low temperature crystallization process to convert the amorphous silicon film into a polysilicon film, and employing one mask for patterning the polysilicon film to obtain an active layer;

step 3, implementing ion light doping to the entire active layer; implementing ion heavy doping to a partial region of the active layer to form a drain contact region corresponding to the partial region and a first source contact region and a second source contact region, which are respectively located at two sides of the drain contact region and spaced with the same with a certain distance;

wherein a left side of the drain contact region overlaps with a right part of the first vertical part of the gate; a left side of the second source contact region overlaps with the right part of the second vertical part of the gate;

a first lightly doped offset region is formed in a region of the active layer between a left side border of the first source contact region and a left side border of the first vertical part of the gate, a first channel region is formed in a region between a left side border of the first vertical part of the gate and the left side border of the drain contact region, a second lightly doped offset region is formed in a region between a right side border of the drain contact region and a left side border of the second vertical part of the gate, a second channel region is formed in a region between the left side border of the second vertical part of the gate and a left side border of the second source contact region;

step 4, forming a first source, a second source and a drain on the active layer in positions respectively corresponding to the first source contact region, the second source contact region and the drain contact region, and a first overlapping region is formed between a left side of the drain and a right side of the first vertical part of the gate, and a second overlapping region is formed between a left side of the second source and a right side of the second vertical part of the gate;

step 5, depositing a passivation protective layer on the first source, the second source, the drain, the active layer and the gate isolation layer, and employing one mask for patterning the passivation protective layer to respectively form a first via, a second via and a third via correspondingly above the first source, the second source and the drain;

step 6, depositing a conductive layer on the passivation protective layer, and employing one mask for patterning the conductive layer to obtain a first contact electrode, a second contact electrode, a third contact electrode and a connecting wire, and the first contact electrode and the second contact electrode contact with the first source and the second source respectively though the first via and the second via, and the third contact electrode contacts with the drain through the third via;

the connecting wire connects the first contact electrode and the second contact electrode, and the first contact electrode and the second contact electrode respectively contact with the first source and the second source, and then, the first source and the second source are connected to form a U shape source, and thus to make the TFT substrate.

Widths of the first channel region and the second channel region are equal, and widths of the first lightly doped offset region and the second lightly doped offset region are equal, and widths of the first overlapping region and the second overlapping region are equal.

In the step 3, N type ion light doping is implementing to the entire active layer, and P type ion light doping is implementing to the active layer in positions corresponding to the first source contact region, the second source contact region and the drain contact region; or P type ion light doping is implementing to the entire active layer, and N type ion light doping is implementing to the active layer in positions corresponding to the first source contact region, the second source contact region and the drain contact region.

A manufacture method of the gate is: depositing a metal layer on the substrate, and employing one mask for patterning the metal layer to obtain the gate; or is: forming a polysilicon layer on the substrate, and after implementing N type doping to the polysilicon layer, employing one mask for patterning the N type doping polysilicon layer to obtain the gate;

a manufacture method of the first source, the second source and the drain is: depositing a metal layer on the active layer and the gate isolation layer, and employing one mask for patterning the metal layer to obtain the first source, the second source and the drain; or is: forming a polysilicon layer on the active layer and the gate isolation layer, and after implementing N type doping to the polysilicon layer, employing one mask for patterning the N type doping polysilicon layer to obtain the first source, the second source and the drain.

All materials of the first contact electrode, the second contact electrode, the third contact electrode, and the connecting wire are transparent conductive metal oxide substance.

The present invention further provides a TFT substrate, comprising a substrate, a gate located on the substrate, a gate isolation layer located on the gate and the substrate, an active layer located on the gate isolation layer, a first source, a second source and a drain located on the active layer, a passivation protective layer located on the first source, the second source, the drain, the active layer and the gate isolation layer, and a first contact electrode, a second contact electrode, a third contact electrode and a connecting wire;

the gate is a U shape structure, comprising a first vertical part, a second vertical part and a transverse connecting part, connecting corresponding end parts of the first vertical part and the second vertical part;

the active layer comprises a drain contact region and a first source contact region and a second source contact region, which are respectively located at two sides of the drain contact region and spaced with the same with a certain distance;

a first lightly doped offset region is formed in a region of the active layer between a left side border of the first source contact region and a left side border of the first vertical part of the gate, a first channel region is formed in a region between a left side border of the first vertical part of the gate and the left side border of the drain contact region, a second lightly doped offset region is formed in a region between a right side border of the drain contact region and a left side border of the second vertical part of the gate, a second channel region is formed in a region between the left side border of the second vertical part of the gate and a left side border of the second source contact region;

the first source, the second source and the drain are located on the active layer respectively corresponding to the first source contact region, the second source contact region and the drain contact region; and a first overlapping region is formed between a left side of the drain and a right side of the first vertical part of the gate, and a second overlapping region is formed between a left side of the second source and a right side of the second vertical part of the gate;

the passivation protective layer comprises a first via, a second via and a third via respectively above the first source, the second source and the drain, correspondingly, and the first contact electrode and the second contact electrode contact with the first source and the second source respectively though the first via and the second via, and the third contact electrode contacts with the drain through the third via; the first contact electrode and the second contact electrode are connected together through the connecting wire, and thus to connect the first source and the second source together to form a U shape source.

Widths of the first channel region and the second channel region are equal, and widths of the first lightly doped offset region and the second lightly doped offset region are equal, and widths of the first overlapping region and the second overlapping region are equal.

The first source contact region, the second source contact region and the drain contact region are N type heavy doping regions, and the first lightly doped offset region, the second lightly doped offset region, the first channel region and the second channel region are P type light doping regions; or the first source contact region, the second source contact region and the drain contact region are P type heavy doping regions, and the first lightly doped offset region, the second lightly doped offset region, the first channel region and the second channel region are N type light doping regions.

The gate, the first source, the second source and the drain are metal layers or N type doping polysilicon layers.

All materials of the first contact electrode, the second contact electrode, the third contact electrode, and the connecting wire are transparent conductive metal oxide substance.

The present invention further provides a TFT substrate, comprising a substrate, a gate located on the substrate, a gate isolation layer located on the gate and the substrate, an active layer located on the gate isolation layer, a first source, a second source and a drain located on the active layer, a passivation protective layer located on the first source, the second source, the drain, the active layer and the gate isolation layer, and a first contact electrode, a second contact electrode, a third contact electrode and a connecting wire;

the gate is a U shape structure, comprising a first vertical part, a second vertical part and a transverse connecting part, connecting corresponding end parts of the first vertical part and the second vertical part;

the active layer comprises a drain contact region and a first source contact region and a second source contact region, which are respectively located at two sides of the drain contact region and spaced with the same with a certain distance;

a first lightly doped offset region is formed in a region of the active layer between a left side border of the first source contact region and a left side border of the first vertical part of the gate, a first channel region is formed in a region between a left side border of the first vertical part of the gate and the left side border of the drain contact region, a second lightly doped offset region is formed in a region between a right side border of the drain contact region and a left side border of the second vertical part of the gate, a second channel region is formed in a region between the left side border of the second vertical part of the gate and a left side border of the second source contact region;

the first source, the second source and the drain are located on the active layer respectively corresponding to the first source contact region, the second source contact region and the drain contact region; and a first overlapping region is formed between a left side of the drain and a right side of the first vertical part of the gate, and a second overlapping region is formed between a left side of the second source and a right side of the second vertical part of the gate;

the passivation protective layer comprises a first via, a second via and a third via respectively above the first source, the second source and the drain, correspondingly, and the first contact electrode and the second contact electrode contact with the first source and the second source respectively though the first via and the second via, and the third contact electrode contacts with the drain through the third via; the first contact electrode and the second contact electrode are connected together through the connecting wire, and thus to connect the first source and the second source together to form a U shape source;

wherein widths of the first channel region and the second channel region are equal, and widths of the lightly doped offset region and the second lightly doped offset region are equal, and widths of the first overlapping region and the second overlapping region are equal;

wherein the first source contact region, the second source contact region and the drain contact region are N type heavy doping regions, and the first lightly doped offset region, the second lightly doped offset region, the first channel region and the second channel region are P type light doping regions; or the first source contact region, the second source contact region and the drain contact region are P type heavy doping regions, and the first lightly doped offset region, the second lightly doped offset region, the first channel region and the second channel region are N type light doping regions.

The benefits of the present invention are: the present invention provides a manufacture method of a TFT substrate. By locating the first channel region and the first lightly doped offset region between the first source and the drain, and locating the second channel region and the second lightly doped offset region between the second source and the drain, and forming the first overlapping region and the second overlapping region respectively between the drain and the gate and between the second source and the gate, thus, the paths of the current flowing from the first, the second sources to the drain and the current flowing from the drain to the first, the second sources are the same. Namely, the current path from source to the drain and the current path from the drain to the source are the same. According, the symmetry of the TFT structure is realized, and even the drain and the source are exchanged for usage in the practical work will not influence the current flowing through the TFT element to raise the electrical performance of the TFT element. In the manufactured TFT substrate of the present invention, both the path from the drain to the source and the path from the source to the drain in the TFT requires passing through two offset structures and two overlapping structures, which does not only reduce the off state, raise the on state current but also makes the current path possess symmetry to avoid the influence of the asymmetry of the element structure to the current path in the LTPS TFT and to raise the electrical performance of the TFT element.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
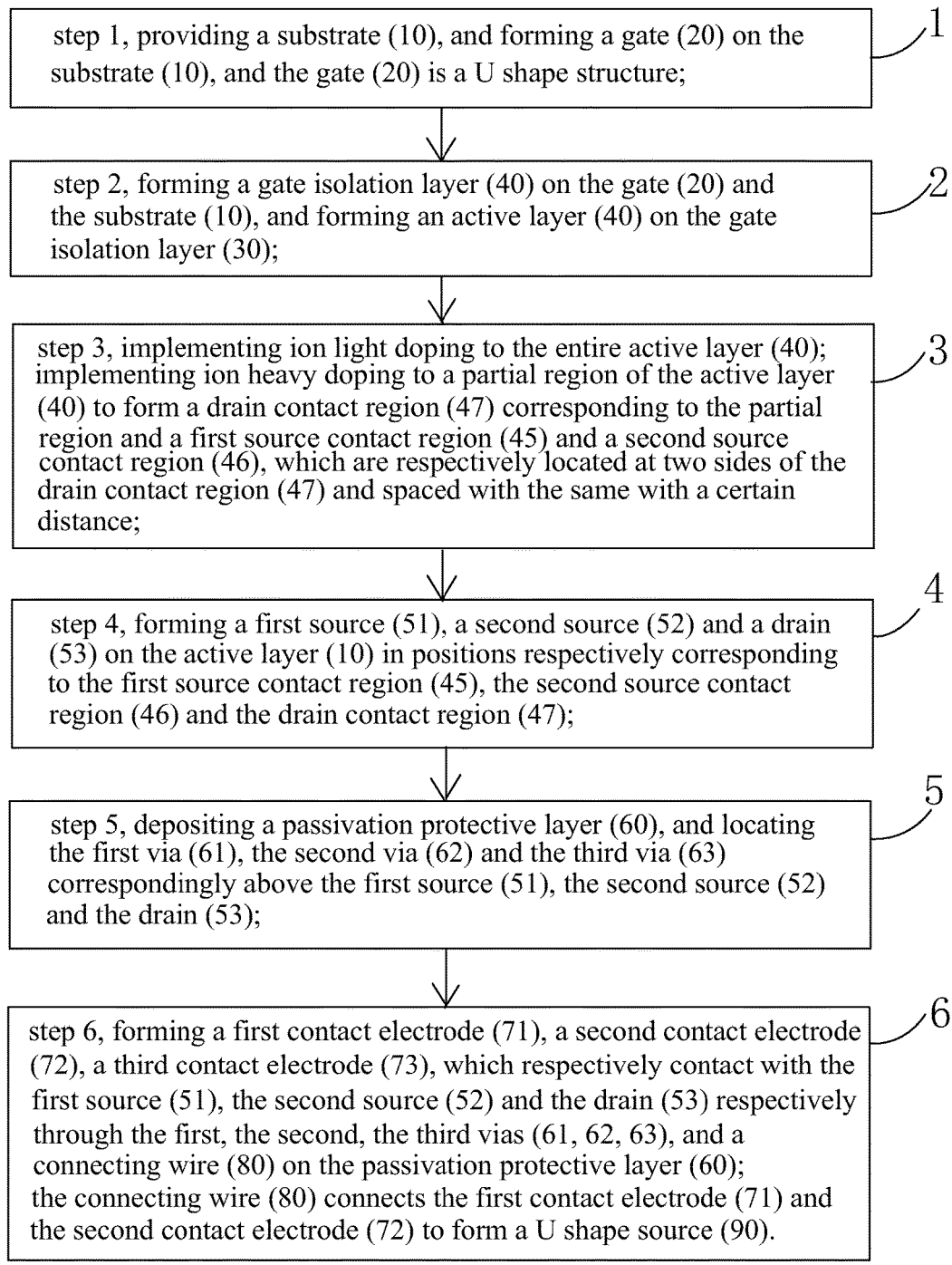
FIG. 1 is a flowchart of a manufacture method of a TFT substrate according to the present invention.
Figure 2:
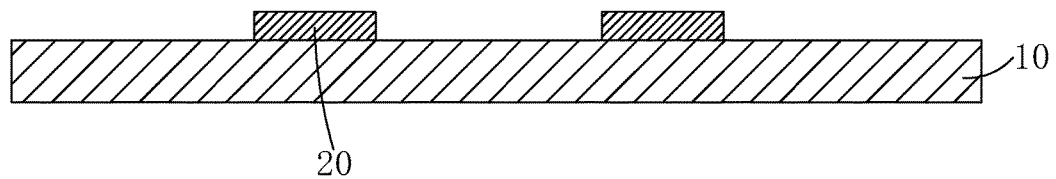
FIGS. 2-3 are diagrams of the step 1 of a manufacture method of a TFT substrate according to the present invention.
Figure 3:
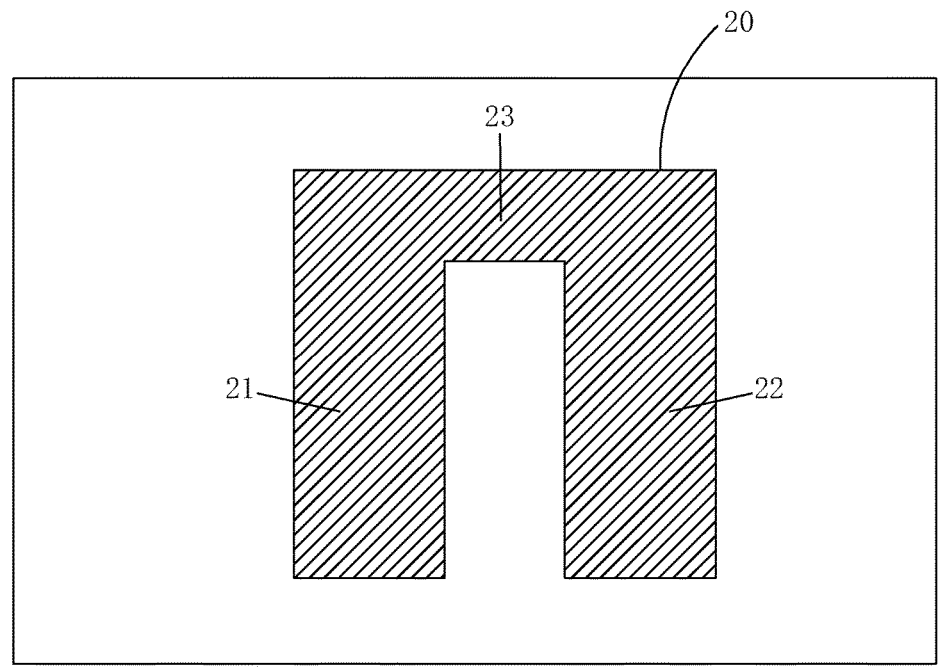

Please refer to FIG. 1. The present invention provides a manufacture method of a TFT substrate, comprising steps of:

step 1, as shown in FIGS. 2-3, providing a substrate 10, and forming a gate 20 on the substrate 10, and the gate 20 is a U shape structure, comprising a first vertical part 21, a second vertical part 22 and a transverse connecting part 23, connecting corresponding end parts of the first vertical part 21 and the second vertical part 22.

Specifically, the manufacture method of the gate 20 can be: depositing a metal layer on the substrate 10, and employing one mask for patterning the metal layer to obtain the gate 20.

Specifically, material of the metal layer is metal material, such as aluminum (Al), molybdenum (Mo), copper (Cu) and silver (Ag).

Figure 4:
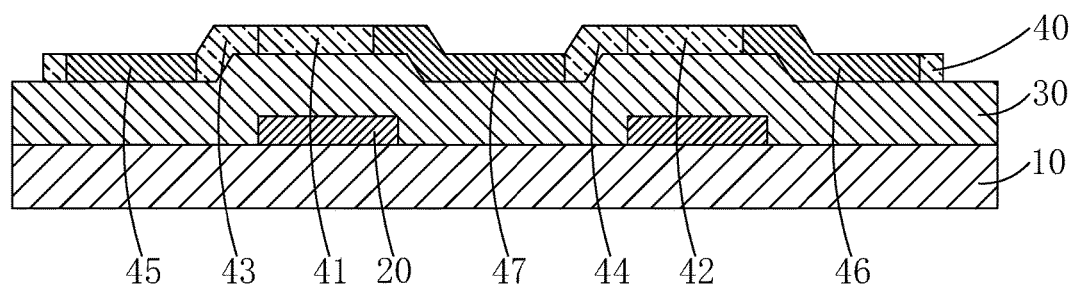
FIGS. 4-5 are diagrams of the step 3 of a manufacture method of a TFT substrate according to the present invention.

Specifically, the manufacture method of the gate 20 also can be: forming a polysilicon layer on the substrate 10, and after implementing N type doping to the polysilicon layer, employing one mask for patterning the N type doping polysilicon layer to obtain the gate 20.

step 2, referring to FIG. 4, depositing a gate isolation layer 30 on the gate 20 and the substrate 10, and depositing amorphous silicon on the gate isolation layer 30 to obtain an amorphous silicon film, and employing a low temperature crystallization process to convert the amorphous silicon film into a polysilicon film, and employing one mask for patterning the polysilicon film to obtain an active layer 40.

Specifically, the gate isolation layer 30 can be a silicon oxide layer ($SiO_x$), a silicon nitride layer ($SiN_x$) or a composite layer superimposed with the silicon oxide layer and the silicon nitride layer.

Figure 5:
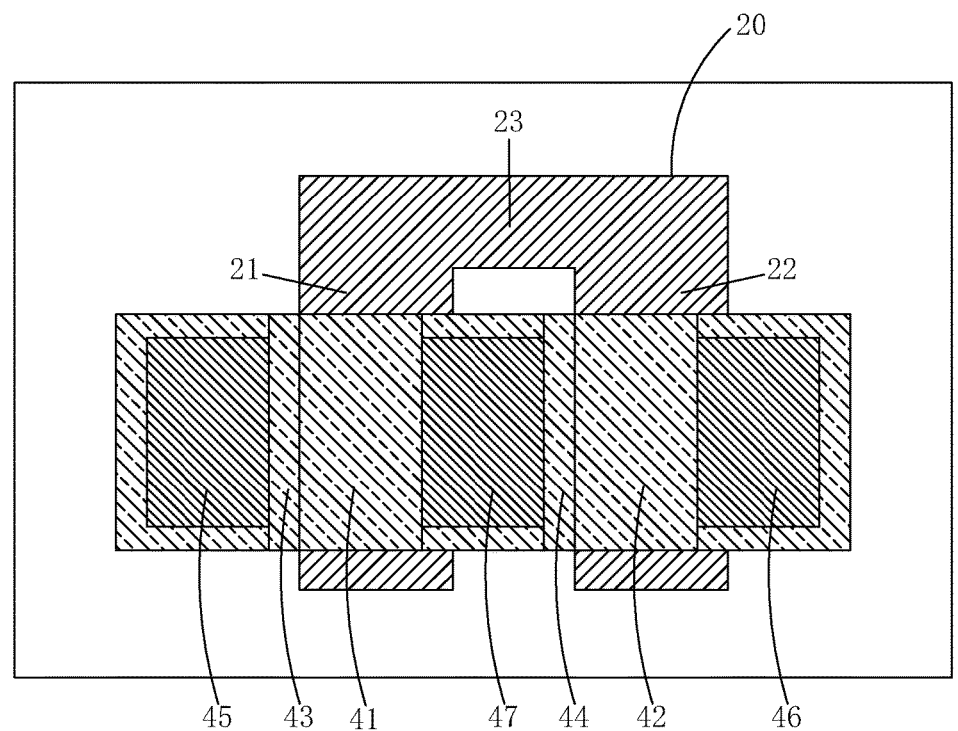

Specifically, the low temperature crystallization process is preferably to be the SPC (Solid Phase Crystallization).

step 3, as shown in FIGS. 4-5, implementing ion light doping to the entire active layer 40; implementing ion heavy doping to a partial region of the active layer 40 to form a drain contact region 47 corresponding to the partial region and a first source contact region 45 and a second source contact region 46, which are respectively located at two sides of the drain contact region 47 and spaced with the same with a certain distance;

wherein a left side of the drain contact region 47 overlaps with a right part of the first vertical part 21 of the gate 20; a left side of the second source contact region 46 overlaps with the right part of the second vertical part 22 of the gate 20;

a first lightly doped offset region 45 is formed in a region of the active layer 40 between a left side border of the first source contact region 45 and a left side border of the first vertical part 21 of the gate 20, a first channel region 41 is formed in a region between a left side border of the first vertical part 21 of the gate 20 and the left side border of the drain contact region 47, a second lightly doped offset region 44 is formed in a region between a right side border of the drain contact region 47 and a left side border of the second vertical part 22 of the gate 20, a second channel region 42 is formed in a region between the left side border of the second vertical part 22 of the gate 120 and a left side border of the second source contact region 46.

Specifically, widths of the first channel region 41 and the second channel region 42 are equal, and widths of the first lightly doped offset region 43 and the second lightly doped offset region 44 are equal.

In the step 3, N type ion light doping is implementing to the entire active layer 40, and P type ion light doping is implementing to the active layer 40 in positions corresponding to the first source contact region 45, the second source contact region 46 and the drain contact region 47; or P type ion light doping is implementing to the entire active layer 40, and N type ion light doping is implementing to the active layer 40 in positions corresponding to the first source contact region 45, the second source contact region 46 and the drain contact region 47.

Figure 6:
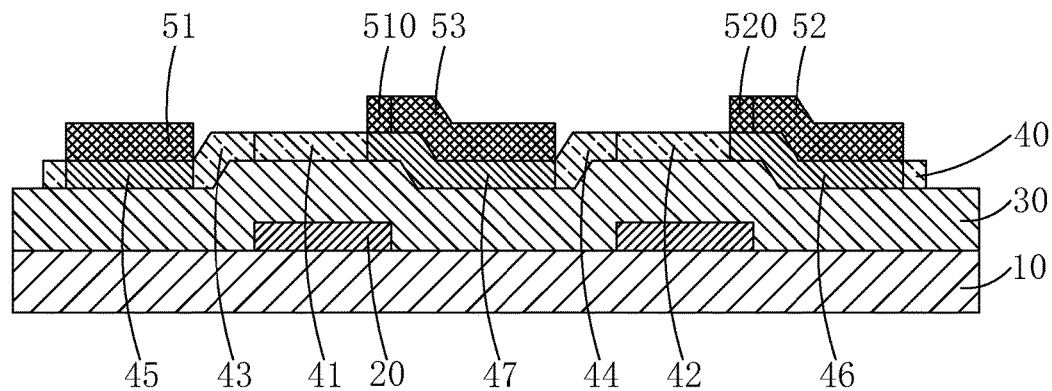
FIGS. 6-7 are diagrams of the step 4 of a manufacture method of a TFT substrate according to the present invention.
Figure 7:
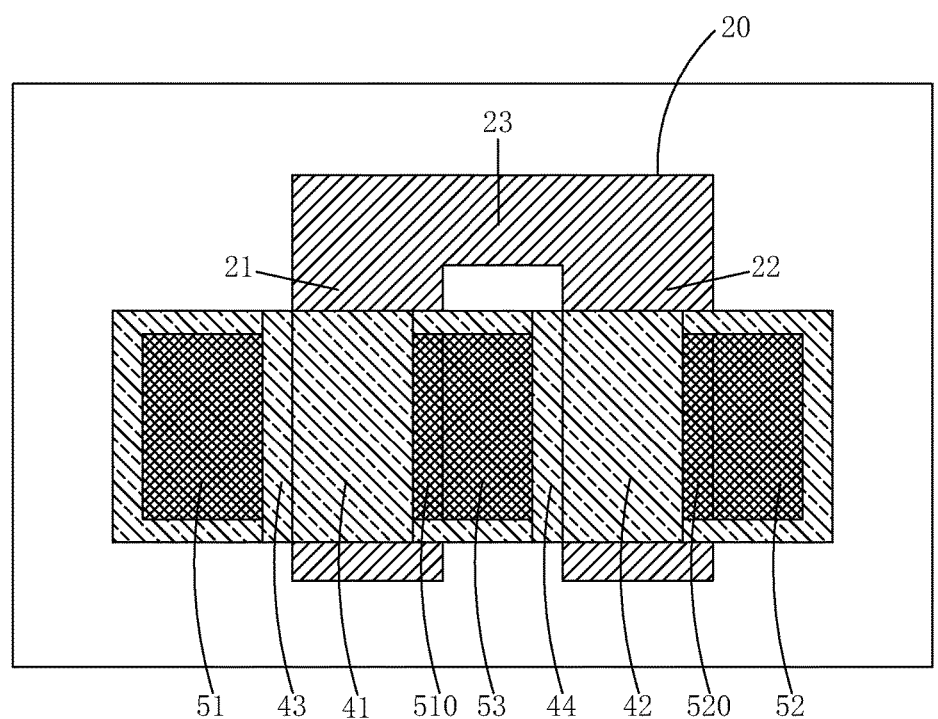

Preferably, the N type ion is phosphorus ion or arsenic ion; the P type ion is boron ion or gallium ion.

step 4, as shown in FIGS. 6-7, forming a first source 51, a second source 52 and a drain 53 on the active layer 40 in positions respectively corresponding to the first source contact region 45, the second source contact region 46 and the drain contact region 47, and a first overlapping region 510 is formed between a left side of the drain 53 and a right side of the first vertical part 21 of the gate 20, and a second overlapping region 520 is formed between a left side of the second source 52 and a right side of the second vertical part 21 of the gate 20.

Specifically, widths of the first overlapping region 510 and the second overlapping region 520 are equal.

Specifically, a manufacture method of the first source 51, the second source 52 and the drain 53 can be: depositing a metal layer on the active layer 40 and the gate isolation layer 30, and employing one mask for patterning the metal layer to obtain the first source 51, the second source 52 and the drain 53.

Specifically, material of the metal layer is metal material, such as aluminum (Al), molybdenum (Mo), copper (Cu) and silver (Ag).

A manufacture method of the first source 51, the second source 52 and the drain 53 also can be: forming a polysilicon layer on the active layer 40 and the gate isolation layer 30, and after implementing N type doping to the polysilicon layer, employing one mask for patterning the N type doping polysilicon layer to obtain the first source 51, the second source 52 and the drain 53.

Figure 8:
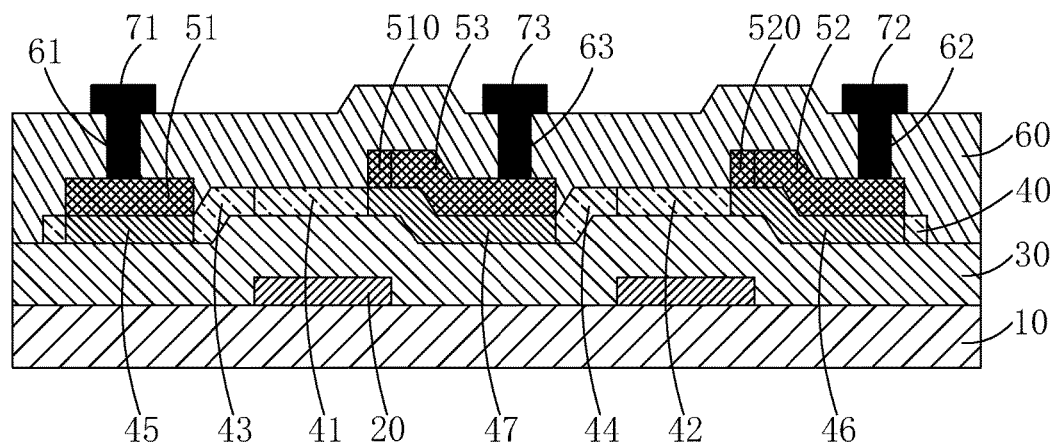
FIGS. 8-9 are diagrams of the step 6 of a manufacture method of a TFT substrate according to the present invention.

Specifically, the first lightly doped offset region 43 and the second lightly doped offset region 44 forms a high resistance region to reduce the off state current of the LTPS TFT. The first overlapping region 510 and the second overlapping region 520 can decrease the channel length of the LTPS TFT and minimize the high resistance region, and thus to raise the on state current.

step 5, referring to FIG. 8, depositing a passivation protective layer 60 on the first source 51, the second source 52, the drain 53, the active layer 40 and the gate isolation layer 30, and employing one mask for patterning the passivation protective layer 60 to respectively form a first via 61, a second via 62 and a third via 63 correspondingly above the first source 51, the second source 52 and the drain 53.

Figure 9:
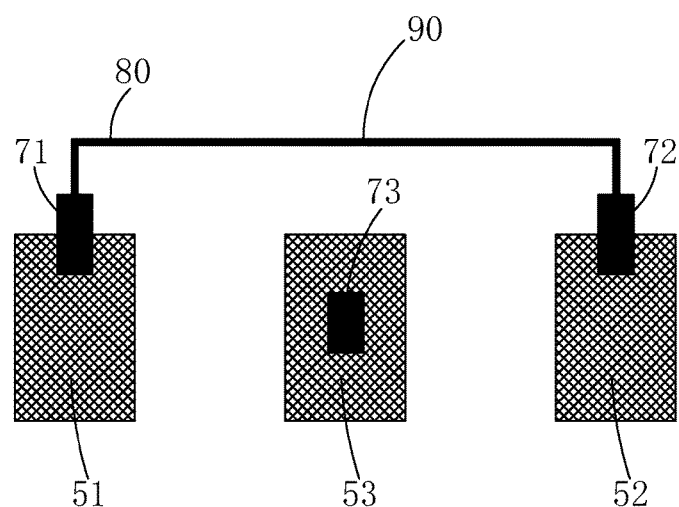

Specifically, the passivation protective layer 60 can be a silicon oxide layer ($SiO_x$), a silicon nitride layer ($SiN_x$) or a composite layer superimposed with the silicon oxide layer and the silicon nitride layer.

step 6, as shown in FIG. 8, depositing a conductive layer on the passivation protective layer 60, and employing one mask for patterning the conductive layer to obtain a first contact electrode 71, a second contact electrode 72, a third contact electrode 73 and a connecting wire 80, and the first contact electrode 71 and the second contact electrode 72 contact with the first source 51 and the second source 52 respectively though the first via 61 and the second via 62, and the third contact electrode 73 contacts with the drain 53 through the third via 73;

as shown in FIG. 9, the connecting wire 80 connects the first contact electrode 71 and the second contact electrode 72, and the first contact electrode 71 and the second contact electrode 72 respectively contact with the first source 51 and the second source 52, and then, the first source 51 and the second source 52 are connected to form a U shape source 90, and thus to make the TFT substrate.

Specifically, all materials of the first contact electrode 71, the second contact electrode 72, the third contact electrode 73, and the connecting wire 80 are transparent conductive metal oxide substance, and preferably to be ITO (Indium Tin Oxide).

Specifically, one of the use of the first contact electrode 71, the second contact electrode 72, the third contact electrode 73 is employed to be wires to connect the first source 51, the second source 52 and the drain 53 to the data lines, and another of use is employed to be test points for testing the voltage signals of the first source 51, the second source 52 and the drain 53.

Figure 10:
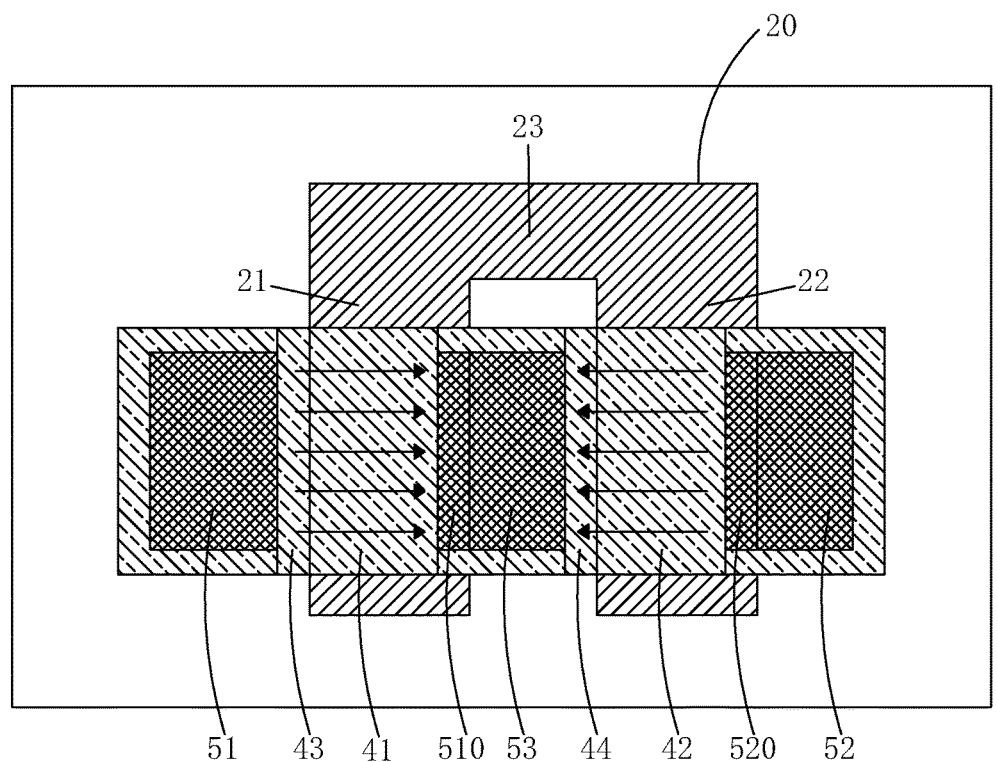
FIG. 10 is a diagram of a current flow direction as the source is high voltage in the TFT substrate manufactured by the present invention.
Figure 11:
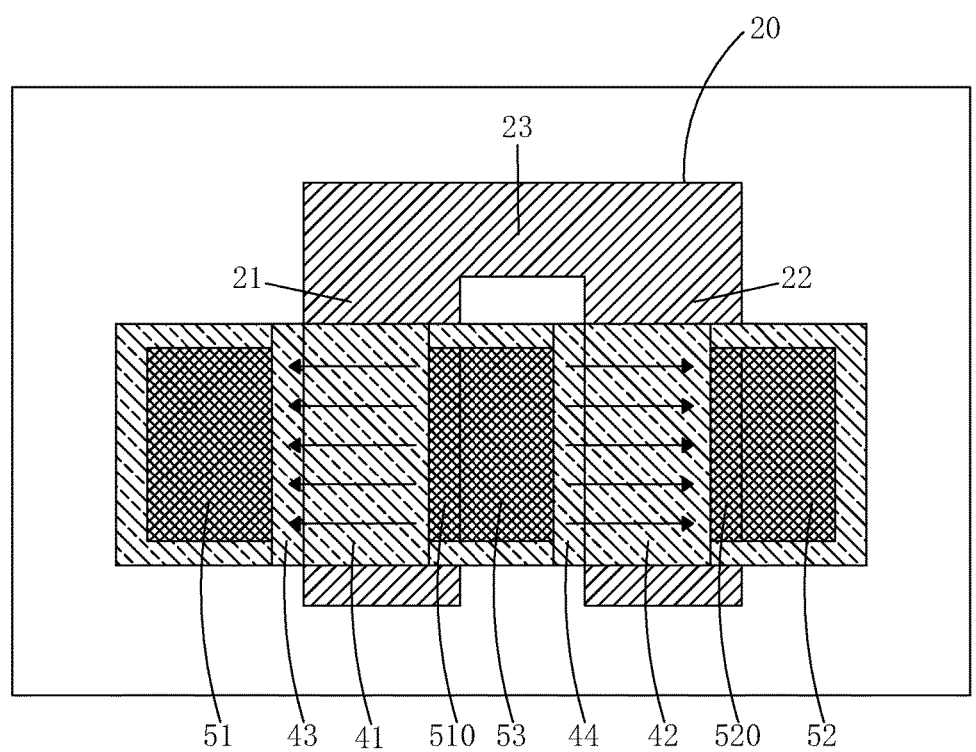
FIG. 11 is a diagram of a current flow direction as the drain is high voltage in the TFT substrate manufactured by the present invention.

As shown in FIG. 10, as the source 90 in the TFT substrate is high voltage, the current flowing from the source 90 to the drain 53 comprises two branch currents, which respectively are a first branch current flowing from the first source 51 to the drain 53 and a second branch current flowing from the second source 52 to the drain 53, wherein the first branch current flows through the first lightly doped offset region 43, the first channel region 41 and the first overlapping region 510, and the second branch current flows through the second overlapping region 520, the second channel region 42 and the second lightly doped offset region 44;

as shown in FIG. 11, as the drain 53 in the TFT substrate is high voltage, the current flowing from the drain 53 to the source 90 comprises two branch currents, which respectively are a third branch current flowing from the drain 53 to the first source 51 and a fourth branch current flowing from the drain 53 to the second source 52, wherein the third branch current flows through the first overlapping region 510, the first channel region 41 and the first lightly doped offset region 43, and the fourth branch current flows through the second lightly doped offset region 44, the second channel region 42 and the second overlapping region 520;

Because the widths of the first channel region 41 and the second channel region 42 are equal, and the widths of the first lightly doped offset region 43 and the second lightly doped offset region 44 are equal, and the widths of the first overlapping region 510 and the second overlapping region 520 are equal, the paths of the two branch currents flowing from the source 90 to the drain 53 and the paths of the two branch currents flowing from drain 53 to the source 90 are substantially the same. Thus, the symmetry of the TFT structure is ensured, and even the drain 53 and the source 90 are exchanged for usage in the practical work will not influence the current flowing through the TFT element.

In the aforesaid manufacture method of the TFT substrate, by locating the first channel region 41 and the first lightly doped offset region 43 between the first source 51 and the drain 53, and locating the second channel region 42 and the second lightly doped offset region 44 between the second source 52 and the drain 53, and forming the first overlapping region 510 and the second overlapping region 520 respectively between the drain 53 and the gate 20 and between the second source 52 and the gate 20, thus, the paths of the current flowing from the first, the second sources 51, 52 to the drain 53 and the current flowing from the drain 53 to the first, the second sources 51, 52 are the same. Namely, the current path from source 90 to the drain 53 and the current path from the drain 53 to the source 90 are the same. According, the symmetry of the TFT structure is realized, and even the drain 53 and the source 90 are exchanged for usage in the practical work will not influence the current flowing through the TFT element to raise the electrical performance of the TFT element.

Please refer to FIGS. 8-9, with FIGS. 4-7, together, the present invention further provides a TFT substrate, comprising a substrate 10, a gate 20 located on the substrate 10, a gate isolation layer 30 located on the gate 20 and the substrate 10, an active layer 40 located on the gate isolation layer 30, a first source 51, a second source 52 and a drain 53 located on the active layer 40, a passivation protective layer 60 located on the first source 51, the second source 52, the drain 53, the active layer 40 and the gate isolation layer 30, and a first contact electrode 71, a second contact electrode 72, a third contact electrode 73 and a connecting wire 80;

the gate 20 is a U shape structure, comprising a first vertical part 21, a second vertical part 22 and a transverse connecting part 23, connecting corresponding end parts of the first vertical part 21 and the second vertical part 22;

the active layer 40 comprises a drain contact region 47 and a first source contact region 45 and a second source contact region 46, which are respectively located at two sides of the drain contact region 47 and spaced with the same with a certain distance;

a first lightly doped offset region 45 is formed in a region of the active layer 40 between a left side border of the first source contact region 45 and a left side border of the first vertical part 21 of the gate 20, a first channel region 41 is formed in a region between a left side border of the first vertical part 21 of the gate 20 and the left side border of the drain contact region 47, a second lightly doped offset region 44 is formed in a region between a right side border of the drain contact region 47 and a left side border of the second vertical part 22 of the gate 20, a second channel region 42 is formed in a region between the left side border of the second vertical part 22 of the gate 120 and a left side border of the second source contact region 46.

A first source 51, a second source 52 and a drain 53 are formed on the active layer 40 in positions respectively corresponding to the first source contact region 45, the second source contact region 46 and the drain contact region 47; and a first overlapping region 510 is formed between a left side of the drain 53 and a right side of the first vertical part 21 of the gate 20, and a second overlapping region 520 is formed between a left side of the second source 52 and a right side of the second vertical part 21 of the gate 20;

the passivation protective layer 60 comprises a first via 61, a second via 62 and a third via 63 respectively above the first source 51, the second source 52 and the drain 53, correspondingly, and the first contact electrode 71 and the second contact electrode 72 contact with the first source 51 and the second source 52 respectively though the first via 61 and the second via 62, and the third contact electrode 73 contacts with the drain 53 through the third via 63; the first contact electrode 71 and the second contact electrode 72 are connected together through the connecting wire 80, and thus to connect the first source 51 and the second source 52 together to form a U shape source 90.

Specifically, the first lightly doped offset region 43 and the second lightly doped offset region 44 forms a high resistance region to reduce the off state current of the LTPS TFT. The first overlapping region 510 and the second overlapping region 520 can decrease the channel length of the LTPS TFT and minimize the high resistance region, and thus to raise the on state current.

Specifically, widths of the first channel region 41 and the second channel region 42 are equal, and widths of the first lightly doped offset region 43 and the second lightly doped offset region 44 are equal, and widths of the first overlapping region 510 and the second overlapping region 520 are equal.

Specifically, the gate 20, the first source 51, the second source 52 and the drain 53 can be metal layers or can be N type doping polysilicon layers. Specifically, material of the metal layer is metal material, such as aluminum (Al), molybdenum (Mo), copper (Cu) and silver (Ag).

Specifically, the first source contact region 45, the second source contact region 46 and the drain contact region 47 are N type heavy doping regions, and the first lightly doped offset region 43, the second lightly doped offset region 44, the first channel region 41 and the second channel region 42 are P type light doping regions; or the first source contact region 45, the second source contact region 46 and the drain contact region 47 are P type heavy doping regions, and the first lightly doped offset region 43, the second lightly doped offset region 44, the first channel region 41 and the second channel region 42 are N type light doping regions.

Preferably, the ion doped in the N type doping region is phosphorus ion or arsenic ion; the ion doped in the P type doping region is boron ion or gallium ion.

Specifically, the gate isolation layer 30 and the passivation protective layer 60 can be silicon oxide layers ($SiO_x$), silicon nitride layers ($SiN_x$) or composite layers superimposed with the silicon oxide layers and the silicon nitride layers.

Specifically, all materials of the first contact electrode 71, the second contact electrode 72, the third contact electrode 73, and the connecting wire 80 are transparent conductive metal oxide substance, and preferably to be ITO (Indium Tin Oxide).

Specifically, one of the use of the first contact electrode 71, the second contact electrode 72, the third contact electrode 73 is employed to be wires to connect the first source 51, the second source 52 and the drain 53 to the data lines, and another of use is employed to be test points for testing the voltage signals of the first source 51, the second source 52 and the drain 53.

In the aforesaid TFT substrate, by locating the first channel region 41 and the first lightly doped offset region 43 between the first source 51 and the drain 53, and locating the second channel region 42 and the second lightly doped offset region 44 between the second source 52 and the drain 53, and forming the first overlapping region 510 and the second overlapping region 520 respectively between the drain 53 and the gate 20 and between the second source 52 and the gate 20, thus, the paths of the current flowing from the first, the second sources 51, 52 to the drain 53 and the current flowing from the drain 53 to the first, the second sources 51, 52 are the same. Namely, the current path from source 90 to the drain 53 and the current path from the drain 53 to the source 90 are the same. According, the symmetry of the TFT structure is realized, and even the drain 53 and the source 90 are exchanged for usage in the practical work will not influence the current flowing through the TFT element to raise the electrical performance of the TFT element.

In conclusion, the present invention provides a manufacture method of a TFT substrate. By locating the first channel region and the first lightly doped offset region between the first source and the drain, and locating the second channel region and the second lightly doped offset region between the second source and the drain, and forming the first overlapping region and the second overlapping region respectively between the drain and the gate and between the second source and the gate, thus, the paths of the current flowing from the first, the second sources to the drain and the current flowing from the drain to the first, the second sources are the same. Namely, the current path from source to the drain and the current path from the drain to the source are the same. According, the symmetry of the TFT structure is realized, and even the drain and the source are exchanged for usage in the practical work will not influence the current flowing through the TFT element to raise the electrical performance of the TFT element. In the manufactured TFT substrate of the present invention, both the path from the drain to the source and the path from the source to the drain in the TFT requires passing through two offset structures and two overlapping structures, which does not only reduce the off state, raise the on state current but also makes the current path possess symmetry to avoid the influence of the asymmetry of the element structure to the current path in the LTPS TFT and to raise the electrical performance of the TFT element.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of a TFT substrate, comprising steps of:

step 1, providing a substrate, and forming a gate on the substrate, and the gate is a U shape structure, comprising a first vertical part, a second vertical part and a transverse connecting part, connecting corresponding end parts of the first vertical part and the second vertical part;

step 2, depositing a gate isolation layer on the gate and the substrate, and depositing amorphous silicon on the gate isolation layer to obtain an amorphous silicon film, and employing a low temperature crystallization process to convert the amorphous silicon film into a polysilicon film, and employing one mask for patterning the polysilicon film to obtain an active layer;

step 3, implementing ion light doping to the entire active layer; implementing ion heavy doping to a partial region of the active layer to form a drain contact region corresponding to the partial region and a first source contact region and a second source contact region, which are respectively located at two sides of the drain contact region and spaced with the same with a certain distance;

wherein a left side of the drain contact region overlaps with a right part of the first vertical part of the gate; a left side of the second source contact region overlaps with the right part of the second vertical part of the gate;

a first lightly doped offset region is formed in a region of the active layer between a left side border of the first source contact region and a left side border of the first vertical part of the gate, a first channel region is formed in a region between a left side border of the first vertical part of the gate and the left side border of the drain contact region, a second lightly doped offset region is formed in a region between a right side border of the drain contact region and a left side border of the second vertical part of the gate, a second channel region is formed in a region between the left side border of the second vertical part of the gate and a left side border of the second source contact region;

step 4, forming a first source, a second source and a drain on the active layer in positions respectively corresponding to the first source contact region, the second source contact region and the drain contact region, and a first overlapping region is formed between a left side of the drain and a right side of the first vertical part of the gate, and a second overlapping region is formed between a left side of the second source and a right side of the second vertical part of the gate;

step 5, depositing a passivation protective layer on the first source, the second source, the drain, the active layer and the gate isolation layer, and employing one mask for patterning the passivation protective layer to respectively form a first via, a second via and a third via correspondingly above the first source, the second source and the drain;

step 6, depositing a conductive layer on the passivation protective layer, and employing one mask for patterning the conductive layer to obtain a first contact electrode, a second contact electrode, a third contact electrode and a connecting wire, and the first contact electrode and the second contact electrode contact with the first source and the second source respectively though the first via and the second via, and the third contact electrode contacts with the drain through the third via;

the connecting wire connects the first contact electrode and the second contact electrode, and the first contact electrode and the second contact electrode respectively contact with the first source and the second source, and then, the first source and the second source are connected to form a U shape source, and thus to make the TFT substrate.

2. The manufacture method of the TFT substrate according to claim 1, wherein widths of the first channel region and the second channel region are equal, and widths of the first lightly doped offset region and the second lightly doped offset region are equal, and widths of the first overlapping region and the second overlapping region are equal.

3. The manufacture method of the TFT substrate according to claim 1, wherein in the step 3, N type ion light doping is implementing to the entire active layer, and P type ion light doping is implementing to the active layer in positions corresponding to the first source contact region, the second source contact region and the drain contact region; or P type ion light doping is implementing to the entire active layer, and N type ion light doping is implementing to the active layer in positions corresponding to the first source contact region, the second source contact region and the drain contact region.

4. The manufacture method of the TFT substrate according to claim 1, wherein a manufacture method of the gate is: depositing a metal layer on the substrate, and employing one mask for patterning the metal layer to obtain the gate; or is: forming a polysilicon layer on the substrate, and after implementing N type doping to the polysilicon layer, employing one mask for patterning the N type doping polysilicon layer to obtain the gate;

a manufacture method of the first source, the second source and the drain is:

depositing a metal layer on the active layer and the gate isolation layer, and employing one mask for patterning the metal layer to obtain the first source, the second source and the drain; or is: forming a polysilicon layer on the active layer and the gate isolation layer, and after implementing N type doping to the polysilicon layer, employing one mask for patterning the N type doping polysilicon layer to obtain the first source, the second source and the drain.

5. The manufacture method of the TFT substrate according to claim 1, wherein all materials of the first contact electrode, the second contact electrode, the third contact electrode, and the connecting wire are transparent conductive metal oxide substance.

6. A TFT substrate, comprising a substrate, a gate located on the substrate, a gate isolation layer located on the gate and the substrate, an active layer located on the gate isolation layer, a first source, a second source and a drain located on the active layer, a passivation protective layer located on the first source, the second source, the drain, the active layer and the gate isolation layer, and a first contact electrode, a second contact electrode, a third contact electrode and a connecting wire;

the gate is a U shape structure, comprising a first vertical part, a second vertical part and a transverse connecting part, connecting corresponding end parts of the first vertical part and the second vertical part;

the active layer comprises a drain contact region and a first source contact region and a second source contact region, which are respectively located at two sides of the drain contact region and spaced with the same with a certain distance;

a first lightly doped offset region is formed in a region of the active layer between a left side border of the first source contact region and a left side border of the first vertical part of the gate, a first channel region is formed in a region between a left side border of the first vertical part of the gate and the left side border of the drain contact region, a second lightly doped offset region is formed in a region between a right side border of the drain contact region and a left side border of the second vertical part of the gate, a second channel region is formed in a region between the left side border of the second vertical part of the gate and a left side border of the second source contact region;

the first source, the second source and the drain are located on the active layer respectively corresponding to the first source contact region, the second source contact region and the drain contact region; and a first overlapping region is formed between a left side of the drain and a right side of the first vertical part of the gate, and a second overlapping region is formed between a left side of the second source and a right side of the second vertical part of the gate;

the passivation protective layer comprises a first via, a second via and a third via respectively above the first source, the second source and the drain, correspondingly, and the first contact electrode and the second contact electrode contact with the first source and the second source respectively though the first via and the second via, and the third contact electrode contacts with the drain through the third via; the first contact electrode and the second contact electrode are connected together through the connecting wire, and thus to connect the first source and the second source together to form a U shape source.

7. The TFT substrate according to claim 6, wherein widths of the first channel region and the second channel region are equal, and widths of the first lightly doped offset region and the second lightly doped offset region are equal, and widths of the first overlapping region and the second overlapping region are equal.

8. The TFT substrate according to claim 6, wherein the first source contact region, the second source contact region and the drain contact region are N type heavy doping regions, and the first lightly doped offset region, the second lightly doped offset region, the first channel region and the second channel region are P type light doping regions; or the first source contact region, the second source contact region and the drain contact region are P type heavy doping regions, and the first lightly doped offset region, the second lightly doped offset region, the first channel region and the second channel region are N type light doping regions.

9. The TFT substrate according to claim 6, wherein the gate, the first source, the second source and the drain are metal layers or N type doping polysilicon layers.

10. The TFT substrate according to claim 6, wherein all materials of the first contact electrode, the second contact electrode, the third contact electrode, and the connecting wire are transparent conductive metal oxide substance.

11. A TFT substrate, comprising a substrate, a gate located on the substrate, a gate isolation layer located on the gate and the substrate, an active layer located on the gate isolation layer, a first source, a second source and a drain located on the active layer, a passivation protective layer located on the first source, the second source, the drain, the active layer and the gate isolation layer, and a first contact electrode, a second contact electrode, a third contact electrode and a connecting wire;

the gate is a U shape structure, comprising a first vertical part, a second vertical part and a transverse connecting part, connecting corresponding end parts of the first vertical part and the second vertical part;

the active layer comprises a drain contact region and a first source contact region and a second source contact region, which are respectively located at two sides of the drain contact region and spaced with the same with a certain distance;

a first lightly doped offset region is formed in a region of the active layer between a left side border of the first source contact region and a left side border of the first vertical part of the gate, a first channel region is formed in a region between a left side border of the first vertical part of the gate and the left side border of the drain contact region, a second lightly doped offset region is formed in a region between a right side border of the drain contact region and a left side border of the second vertical part of the gate, a second channel region is formed in a region between the left side border of the second vertical part of the gate and a left side border of the second source contact region;

the first source, the second source and the drain are located on the active layer respectively corresponding to the first source contact region, the second source contact region and the drain contact region; and a first overlapping region is formed between a left side of the drain and a right side of the first vertical part of the gate, and a second overlapping region is formed between a left side of the second source and a right side of the second vertical part of the gate;

the passivation protective layer comprises a first via, a second via and a third via respectively above the first source, the second source and the drain, correspondingly, and the first contact electrode and the second contact electrode contact with the first source and the second source respectively though the first via and the second via, and the third contact electrode contacts with the drain through the third via; the first contact electrode and the second contact electrode are connected together through the connecting wire, and thus to connect the first source and the second source together to form a U shape source;

wherein widths of the first channel region and the second channel region are equal, and widths of the lightly doped offset region and the second lightly doped offset region are equal, and widths of the first overlapping region and the second overlapping region are equal;

wherein the first source contact region, the second source contact region and the drain contact region are N type heavy doping regions, and the first lightly doped offset region, the second lightly doped offset region, the first channel region and the second channel region are P type light doping regions; or the first source contact region, the second source contact region and the drain contact region are P type heavy doping regions, and the first lightly doped offset region, the second lightly doped offset region, the first channel region and the second channel region are N type light doping regions.

12. The TFT substrate according to claim 11, wherein the gate, the first source, the second source and the drain are metal layers or N type doping polysilicon layers.

13. The TFT substrate according to claim 11, wherein all materials of the first contact electrode, the second contact electrode, the third contact electrode, and the connecting wire are transparent conductive metal oxide substance.

* * * * *